US 6,750,150 B2

(12) United States Patent
Chung et al.

(10) Patent No.: US 6,750,150 B2
(45) Date of Patent: Jun. 15, 2004

(54) METHOD FOR REDUCING DIMENSIONS BETWEEN PATTERNS ON A PHOTORESIST

(75) Inventors: Henry Wei-Ming Chung, Taipei (TW); Shin-Yi Tsai, Hsinchu (TW); Ming-Chung Liang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/978,546

(22) Filed: Oct. 18, 2001

(65) Prior Publication Data

US 2003/0082916 A1 May 1, 2003

(51) Int. Cl.[7] .......................................... H01L 21/1302
(52) U.S. Cl. ..................... 438/706; 438/696; 438/703; 438/714; 438/725; 438/947; 438/951
(58) Field of Search .................................. 438/696, 703, 438/706, 714, 725, 947, 951

(56) References Cited

U.S. PATENT DOCUMENTS

| 4,586,980 A | * | 5/1986 | Hirai et al. | |
| 4,707,218 A | | 11/1987 | Giammarco et al. | |
| 4,838,991 A | | 6/1989 | Cote et al. | |
| 4,871,630 A | | 10/1989 | Giammarco et al. | |
| 4,962,054 A | * | 10/1990 | Shikata | 438/179 |
| 5,618,383 A | * | 4/1997 | Randall | 438/696 |
| 5,770,510 A | * | 6/1998 | Lin et al. | 438/396 |
| 6,100,014 A | | 8/2000 | Lin et al. | |

* cited by examiner

Primary Examiner—Kamand Cuneo
Assistant Examiner—Lisa Kilday
(74) Attorney, Agent, or Firm—Finnegan, Henderson, Farabow, Garrett & Dunner, L.L.P.

(57) ABSTRACT

A semiconductor manufacturing method that includes defining a substrate, depositing a polysilicon layer over the substrate, depositing a layer of photoresist over the polysilicon layer, patterning and defining the photoresist layer, depositing a layer of inorganic material over the patterned and defined photoresist layer, wherein the layer of inorganic material is conformal and photo-insensitive, and anisotropic etching the layer of inorganic material and the layer of semiconductor material.

21 Claims, 2 Drawing Sheets

METHOD FOR REDUCING DIMENSIONS BETWEEN PATTERNS ON A PHOTORESIST

DESCRIPTION OF THE INVENTION

1. Field of the Invention

This invention relates in general to a semiconductor manufacturing process and, more particularly, to a photolithographic method having reduced dimensions between patterns on a photoresist.

2. Background of the Invention

With sub-micron semiconductor manufacturing process being the prevalent technology, the demand for a high-resolution photolithographic process has increased. The resolution of a conventional photolithographic method is primarily dependent upon the wavelength of a light source, which dictates that there be a certain fixed distance between patterns on a photoresist. Distance separating patterns smaller than the wavelength of the light source could not be accurately patterned and defined.

Prior art light sources with lower wavelengths are normally used in a high-resolution photolithographic process. In addition, the depth of focus of a high-resolution photolithographic process is shallower compared to a relative low-resolution photolithographic process. As a result, a photoresist layer having a lower thickness is required for conventional photolithographic methods. However, a photoresist layer having a lower thickness is susceptible to the subsequent etching steps in a semiconductor manufacturing process. This relative ineffective resistance to etching reduces the precision of patterning and defining of a photoresist. These limitations prevent the dimensions of patterns on a photoresist from being reduced.

It is accordingly a primary object of the invention to provide a method for reducing the distance separating patterns on a photoresist layer. In addition, it is another object of the invention to provide a method to enhance the etching resistance of a patterned photoresist layer.

SUMMARY OF THE INVENTION

In accordance with the invention, there is provided a semiconductor manufacturing method that includes depositing a layer of semiconductor material over a substrate, providing a layer of photoresist over the layer of semiconductor material, patterning and defining the photoresist layer, depositing a layer of inorganic material over the patterned and defined photoresist layer, wherein the layer of inorganic material is photo-insensitive, anisotropic etching the layer of inorganic material and the layer of semiconductor material, and removing the patterned and defined photoresist layer.

In another aspect, the layer of inorganic material is substantially conformal.

In yet another aspect, the step of depositing a layer of inorganic material is performed at a temperature lower than a stability temperature of the patterned and defined photoresist layer.

Also in accordance with the present invention, there is provided a semiconductor manufacturing method that includes defining a substrate, depositing a layer of semiconductor material over the substrate, providing a layer of photoresist over the layer of semiconductor material, patterning and defining the photoresist layer to form at least one photoresist structure having at least one substantially vertical sidewall and one substantially horizontal top, depositing a photo-insensitive material over the at least one photoresist structure and the layer of semiconductor material, wherein an amount of the photo-insensitive material deposited on the top of the photoresist structure is substantially greater than an amount of the photo-insensitive material deposited on the at least one sidewall of the photoresist structure, etching the photo-insensitive material and the layer of semiconductor material, and removing the at least one photoresist structure.

In one aspect, the amount of the photo-insensitive material deposited on the top of the photoresist structure is substantially greater than an amount of the photo-insensitive material deposited on the layer of semiconductor material.

Further in accordance with the present invention, there is provided a semiconductor manufacturing method that includes defining a substrate, providing a first layer over the substrate, providing a layer of photoresist over the first layer, patterning and defining the photoresist layer to form at least two photoresist structures, wherein each of the photoresist structures includes substantially vertical sidewalls and a substantially horizontal top, and wherein the photoresist structures are separated by a space, depositing a layer of polymer on the tops of the photoresist structures and the space separating the photoresist structures, wherein an amount of the polymer deposited on the tops of the photoresist structures is substantially greater than an amount of the polymer deposited on the sidewalls of the photoresist structures, and etching the polymer layer on the tops of the photoresist structures and the space between the photoresist structures, and the first layer.

In one aspect, the first layer is a dielectric layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the invention, examples of which are illustrated in the accompanying drawings. Wherever possible, the same reference numbers will be used throughout the drawings to refer to the same or like parts.

Figure 1:
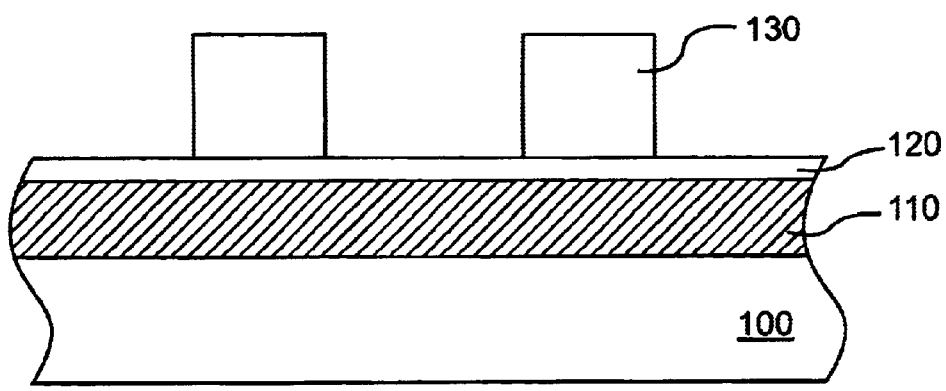
FIGS. 1–3 are cross-sectional views of the semiconductor manufacturing process steps of the present invention.
Figure 2:
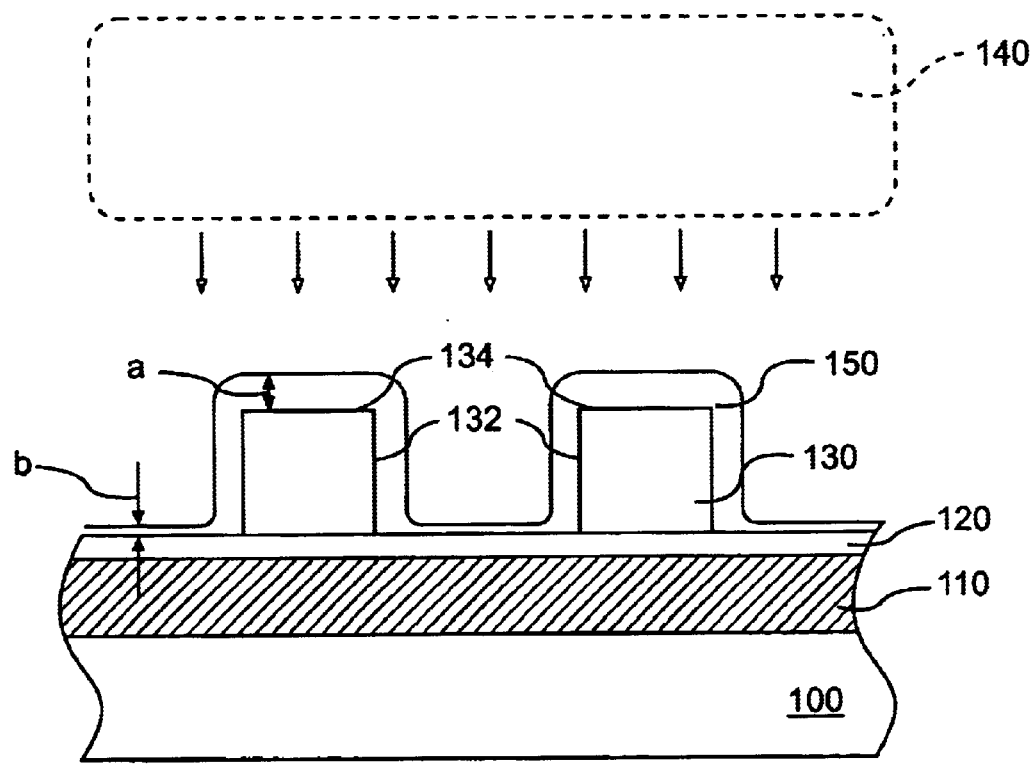

FIGS. 1–3 are cross-sectional views of the semiconductor manufacturing process steps of the present invention. Referring to FIG. 1, the method of the present invention begins by defining a wafer substrate 100. The wafer substrate 100 may be of any known semiconductor substrate material, such as silicon. A first layer 110 is then provided over the wafer substrate 100. In one embodiment, the first layer 110 is a semiconductor material, such as polysilicon. The first layer 110 may also be a dielectric layer or a metal layer. The first layer 110 may be deposited over the wafer substrate 100 by any known deposition process. In another embodiment, the first layer 110 is a dielectric material, in which case the first layer 110 may be deposited or grown over the wafer substrate 100.

An anti-reflection coating (ARC) layer 120 may optionally be provided over the first layer 110 to decrease the reflection from the first layer 110 in the subsequent manufacturing steps. A photoresist layer 130 is then provided over the ARC layer 120. In an embodiment in which an ARC layer is not provided, the photoresist layer 130 is deposited over the first layer 110. The photoresist layer 130 is then patterned and defined using a known photolithographic process to form a patterned and defined photoresist layer having a plurality of photoresist structures 130. The photoresist structures 130 include substantially vertical sidewalls 132 and substantially horizontal tops 134. When the first layer 110 is a semiconductor material, the photoresist structures 130 functions to form conductors from the first layer 110.

Referring to FIG. 2, a second layer 150 is deposited over the patterned and defined photoresist layer 130 by a known chemical vapor deposition apparatus 140. Known chemical vapor deposition processes include plasma enhanced chemical vapor deposition (PECVD) and low pressure chemical vapor deposition (LPCVD). The second layer 150 may be organic or inorganic, and is photo-insensitive. In one embodiment, the second layer 150 is a polymer layer. In another embodiment, the second layer 150 is substantially conformal, covering both the tops 134 and sidewalls 132 of the photoresist structures 130. In one embodiment, the amount of the second layer 150 deposited on the tops 134 of the photoresist structures 130 is substantially greater than the amount adhered to the sidewalls 132. Having a substantially more of the second layer 150 deposited on the tops 134, the photoresist structures 130 become more resistive to the subsequent etching steps, thereby preserving the precision of the photolithographic process. In addition, the step of depositing the second layer 150 is performed at a temperature lower than the stability temperature of the photoresist structures 130. In other words, the second layer 150 is deposited at a temperature not affecting the structural stability of the photoresist structures 130.

After the deposition of the second layer 150, the space between the photoresist structures 130 is decreased, for example, from 0.22 microns to 0.02 microns.

In the PECVD process, the pressure used is in the range of approximately 10 mtorr to 20 mTorr. The power ranges from approximately 500 watts to 800 watts. The deposition rate is between approximately 3,000 Å per minute and 6,000 Å per minute. In addition, the polymer layer 150 comprises at least one hydrocarbon partially substituted by fluorine, the source for forming polymers. The partially-substituted hydrocarbons may be chosen from difluoromethane ($CH_2F_2$), a mixture of difluoromethane and octafluorobutene ($C_4F_8$), and a mixture of difluoromethane and trifluoromethane ($CHF_3$). In one embodiment, when the partially-substituted hydrocarbons include $CH_2F_2$ only, the thickness "a" of a portion of the polymer layer 150 is the same as the thickness "b" of another portion of the polymer layer 150. In another embodiment, when a mixture of $CH_2F_2$ and $C_4F_8$ or a mixture of $CH_2F_2$ and $CHF_3$ is used, the thickness "a" is larger than the thickness "b." Therefore, the thicknesses "a" and "b" may be varied by adjusting the ratios of $CH_2F_2$ to $C_4F_8$ or those of $CH_2F_2$ to $CHF_3$.

Moreover, argon (Ar) and carbon monoxide (CO) may be mixed with the gases introduced during the PECVD process. Argon acts as a carrier to enhance etch uniformity of the photoresist layer 130 and the ARC layer 120. The function of carbon monoxide is to capture fluorine radicals and fluoride ions generated by the fluoro-substituted hydrocarbons. As such, etching of the polymers during the deposition process is prevented, thereby enhancing the deposition rate of the polymer layer 150. Oxygen ($O_2$) and nitrogen ($N_2$) gases also can be added to the PECVD process. Contrary to the function of the carbon monoxide, the presence of oxygen serves to etch the polymer layer 150. Therefore, the deposition rate of polymer layer 150 can be controlled. Also, perfluorohydrocarbons, such as hexafluoroethane ($C_2F_6$) and tetrafluoromethane ($CF_4$), can be mixed with the gases combined with the plasma during the deposition because these gases, similar to the oxygen gas, etch the polymer layer 150.

Figure 3A:
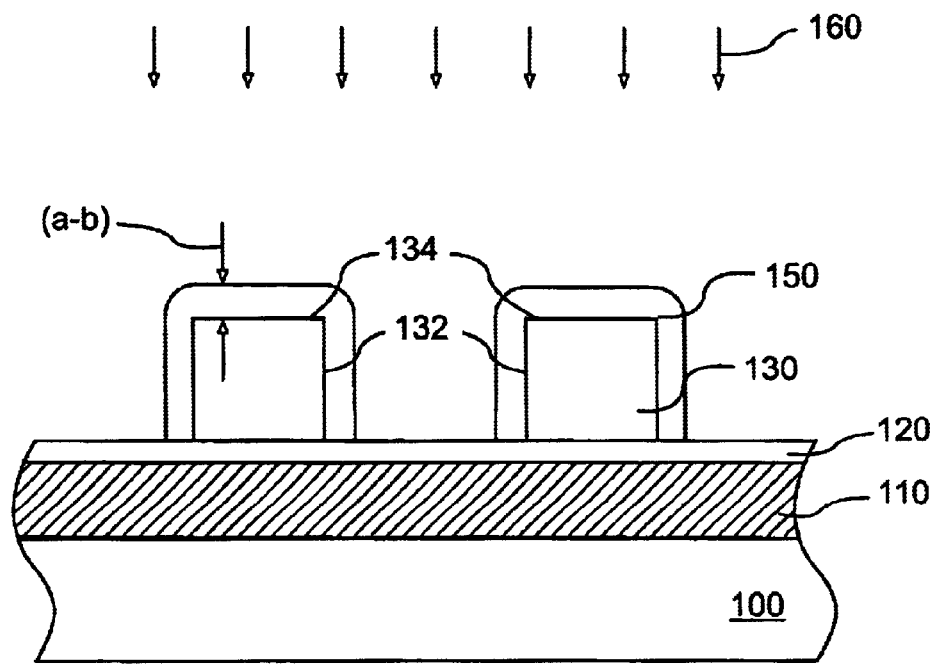
Figure 3B:
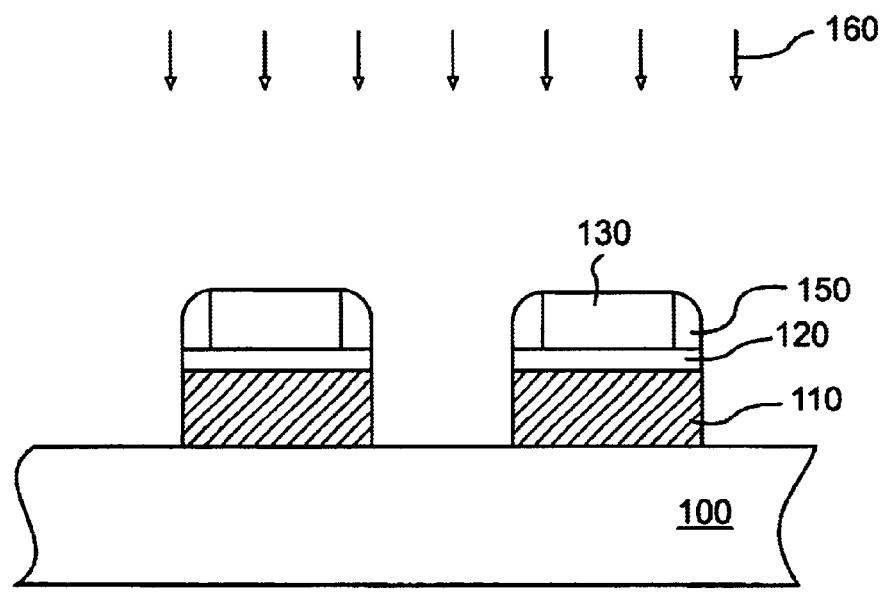

Referring to FIGS. 3A and 3B, the second layer 150, the photoresist structures 130, the ARC layer 120, and the first layer 110 are etched anisotropically with a plasma-based dry etching process. The dry etching process uses plasma 160 In an embodiment in which "a" is thicker than "b," the thickness of the second layer 150 changes from "a" to "a–b" after the second layer 150 deposited over the ARC layer 120 is completely etched away. This shows that the second layer 150 provides excellent resistance to the plasma etch process and therefore enhances the etching resistance of the photoresist structures 130.

As shown in FIG. 3B, when the anisotropic dry etching process continues, the second layer 150 acts as an etch stop and remains on the sidewalls of the photoresist structures 130. Thus, the dimensions between the patterned photoresist and the underlying patterned first layer 110 are reduced. The photoresist structures 130 may be removed using any conventional process.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor manufacturing method, comprising:
   depositing a layer of semiconductor material over a semiconductor substrate;
   providing a layer of photoresist over the layer of semiconductor material;
   patterning and defining the photoresist layer;
   depositing a layer of inorganic material over the patterned and defined photoresist layer, wherein the layer of inorganic material is photo-insensitive;
   anisotropic etching the layer of inorganic material and the layer of semiconductor material; and
   removing the patterned and defined photoresist layer.

2. The method as claimed in claim 1, further comprising a step of depositing a layer of polymer.

3. The method as claimed in claim 1, wherein the layer of inorganic material is substantially conformal.

4. The method as claimed in claim 1, wherein the step of depositing a layer of inorganic material is performed at a temperature lower than a stability temperature of the patterned and defined photoresist layer.

5. The method as claimed in claim 1, wherein the layer of inorganic material is deposited with plasma enhanced chemical vapor deposition at a pressure of between approximately 10 mTorr to 20 mTorr.

6. The method as claimed in claim 1, wherein the layer of inorganic material is deposited with plasma enhanced chemical vapor deposition at a rate of between approximately 3000 Å per minute and 6000 Å per minute.

7. The method as claimed in claim 1 further comprising a step of depositing an anti-reflection coating over the layer of semiconductor material.

8. The method as claimed in claim 1, wherein the layer of semiconductor material comprises one of polysilicon, dielectric material or metallic material.

9. A semiconductor manufacturing method, comprising:

Defining a substrate;

Depositing a layer of semiconductor material over the substrate;

Providing a layer of photoresist over the layer of semiconductor material;

Patterning and defining the photoresist layer to form at least one photoresist structure having at least one substantially vertical sidewall and one substantially horizontal top;

Depositing a photo-insensitive material wherein the photo-insensitive material is inorganic over the at least one photoresist structure and the layer of semiconductor material, wherein an amount of the photoinsenstive material deposited on the top of the photoresist structure is substantially greater than an amount of the photo-insensitive material deposited on the at least one sidewall of the photoresist structure;

Etching the photo-insensitive material and the layer of semiconductor material; and Removing the at least one photoresist structure.

10. The method as claimed in claim 9, wherein the step of depositing a photo-insensitive material comprises a step of depositing a layer of polymer.

11. The method as claimed in claim 9, wherein the step of depositing a photo-insensitive material is provided at a temperature not affecting a stability of the at lest one photoresist structure.

12. The method as claimed in claim 9, wherein the amount of the photo-insensitive material deposited on the top of the photoresist structure is substantially greater than an amount of the photo-insensitive material deposited on the layer of semiconductor material.

13. The method as claimed in claim 9, wherein the layer of semiconductor material comprises polysilicon.

14. A semiconductor manufacturing method, comprising:

defining a substrate;

providing a first layer over the substrate;

providing a layer of photoresist over the first layer;

patterning and defining the photoresist layer to form at least two photoresist structures, wherein each of the photoresist structures includes substantially vertical sidewalls and a substantially horizontal top, and wherein the photoresist structures are separated by a first space;

depositing a photo-insensitive layer on the sidewalls of the photoresist structures such that the photoresist structures with the photo-insensitive layer on the sidewalls thereof are separated by a second space, wherein the first space is greater than the second space; and anisotropic etching of the photo-insensitive layer.

15. The method as claimed in claim 14, wherein the anisotropic etching step comprises etching the first layer using the photoresist structures and the photo-insensitive layer on the sidewalls of the photoresist structures as a mask to form at least two first layer structures separated by a third space, and wherein the third space is narrower than the first space.

16. The method as claimed in claim 14, wherein the first layer comprises one of polysilicon, dielectric material or metallic material.

17. The method as claimed in claim 14, further comprising a step of depositing an anti-reflection coating over the first layer.

18. The method as claimed in claim 14, wherein the photo-insensitive layer comprises polymer.

19. The method as claimed in claim 14, wherein the step of depositing a photo-insensitive layer is performed with plasma enhanced chemical vapor deposition at a rate between approximately 3000 Å per minute and 6000 Å per minute.

20. The method as claimed in claim 14, wherein the step of depositing a photo-insensitive layer is performed at a temperature lower than a stability temperature of the patterned and defined photoresist layer.

21. A semiconductor manufacturing method, comprising:

defining a substrate;

depositing a layer of semiconductor material over the substrate;

providing a layer of photoresist over the layer of semiconductor material;

patterning and defining the photoresist layer to form at least two photoresist structures, wherein each photoresist structure includes at least one substantially vertical sidewall and one substantially horizontal top, and wherein the photoresist structures are separated by a first space;

depositing a photo-insensitive material over the at least two photoresist structures and the layer of semiconductor material, wherein an amount of the photo-insensitive material deposited on the top of the photoresist structures is substantially greater than an amount of the photo-insensitive material deposited on the at least one sidewall of the photoresist structures, wherein the photoresist structures with the photo-insensitive layer on the sidewalls thereof are separated by a second space, and wherein the first space is greater than the second space;

etching the photo-insensitive material and the layer of the semiconductor material; and removing the at least one photoresist structure.

* * * * *